United States Patent [19]

Pelella

[11] Patent Number: 5,614,849

[45] Date of Patent: *Mar. 25, 1997

[54] METHOD OF RESETTING A CMOS AMPLIFIER

[75] Inventor: Antonio R. Pelella, Highland Falls, N.Y.

[73] Assignee: International Business Machines Corporation, Armonk, N.Y.

[*] Notice: The term of this patent shall not extend beyond the expiration date of Pat. No. 5,528,178.

[21] Appl. No.: 484,812

[22] Filed: Jun. 7, 1995

Related U.S. Application Data

[62] Division of Ser. No. 414,391, Mar. 31, 1995.

[51] Int. Cl.$^6$ ........................................ H03F 3/45
[52] U.S. Cl. .................. 327/51; 327/55; 327/57; 327/198
[58] Field of Search ................ 327/51, 52, 54, 327/56, 57, 62, 58, 63, 64, 65, 198, 208, 210, 211, 212, 214, 215

[56] References Cited

U.S. PATENT DOCUMENTS

| | | | |
|---|---|---|---|
| 4,804,871 | 2/1989 | Walters, Jr. ........................ | 327/57 |
| 5,140,199 | 8/1992 | Seo ........................................ | 327/51 |
| 5,282,168 | 1/1994 | Takahashi ............................ | 327/51 |
| 5,297,092 | 3/1994 | Johnson ............................... | 327/51 |
| 5,373,469 | 12/1994 | Akioka et al. ....................... | 327/57 |
| 5,377,150 | 12/1994 | McClure .............................. | 327/51 |
| 5,384,504 | 1/1995 | Dickinson et al. .................. | 327/57 |
| 5,465,060 | 11/1995 | Pelella ................................. | 327/57 |

*Primary Examiner*—Timothy P. Callahan
*Assistant Examiner*—My-Trang Nu Ton
*Attorney, Agent, or Firm*—Varnum, Riddering, Schmidt & Howlett LLP; Lynn L. Augspurger

[57] ABSTRACT

A SRCMOS sense amplifier is provided with a latch in the output stage. When a sense amplifier input signal propagates through the circuit and reaches the output stage, a reset signal is generated resetting and charging the input stage and an enable buffer stage of the amplifier to allow the input stage to begin receiving new data while previous data is latched in the output stage. An output stage reset enable is generated when data is at the output terminals of the output stage. The reset enable is combined with a clock signal in a separate output stage reset circuit to reset the circuit on a clocked basis. A further input to the output stage reset circuit is a feedback from a next circuit stage indicating that the data has been properly received in the next stage. The output stage may be reset either in response to the feedback signal from the next stage or in the presence of the reset enable and the clock signal.

6 Claims, 6 Drawing Sheets

METHOD OF RESETTING A CMOS AMPLIFIER

This is a division of application Ser. No. 08/414,391 filed Mar. 31, 1995.

BACKGROUND OF THE INVENTION

1. Field of the Invention

The invention relates to self-resetting CMOS (SRCMOS) circuitry and more particularly to sense amplifiers used in the receipt of signals from a memory or other device.

2. Description of Related Art

Sense amplifiers are typically used in receiving data over a data bus, typically from a memory or the like, where the signal level is relatively low compared to the signal level used internal to the processor. SRCMOS sense amplifiers are known and in use in the industry. One problem associated with the use of SRCMOS sense amplifiers is the delay introduced by the sense amplifiers due to the fact the data is typically processed through two or more stages and the sense amplifier cannot receive new data signals until previously received data signals have been properly amplified and transmitted to other circuitry within the processor. The prior art SRCMOS sense amplifiers typically consist of three stages, an input stage, a buffer stage and an output or driver stage. In SRCMOS circuitry, the circuits must be reset before additional data can be received. However, the reset must not occur until after the output signals of the sense amplifier circuit have been properly recorded in another circuit within the processor. The reset is performed by charging input gates to a high level, one of which is typically discharged to the memory cell to indicate a signal presence. A certain amount of time is required for this discharge. This reset and discharge tends to introduce undesirable delay.

SCRMOS sense amplifier circuitry is typically reset by means of one or more reset pulses generated by a reset chain which is activated when the input data has reached the output of the amplifier circuit. One way to increase the hold time of the data within the circuit, thereby assuring that there is sufficient time for data to be recorded in a receiving circuit, is to lengthen the delay of the reset chain. A drawback, however, of this technique is that lengthening of the reset chain delay also lengthens the cycle time of the sense amplifier thereby introducing a delay. Such a delay reduces the effective data processing capability of the processor.

SUMMARY OF INVENTION

In accordance with the present invention, problems of the prior art are solved by providing separate resets of the input stage and the output stage of the SCRMOS sense amplifier. More specifically, in accordance with the present invention, the state of an input signal is latched in the output stage and a first reset signal for the input stage is generated from a signal which indicates that the data has reached the output stage. Advantageously, the input stage may be reset or charged without introducing a delay in the input stage related to the time required for the data from the output stage to be registered in a data receiving circuit. This allows gates of the input circuit to begin to be discharged in the process of receiving new data. A second reset signal is generated after the data reaches the output terminals of the sense amplifier. The second reset signal may be generated from a signal received from a data receiving circuit connected to the output terminals of the sense amplifier or from a clock signal occurring after the data has reached the output terminals of the amplifier.

In a specific embodiment of the invention, the sense amplifier includes an input stage, an output stage incorporating a latch, and reset circuitry. A first reset enable signal is transmitted to the reset circuitry when a signal has propagated from the input stage through the enable buffer to the output stage latch. This reset enable signal is used to initiate a reset chain and to selectively reset circuits in the input stage. A second reset enable signal may be generated when the data reaches the output terminals of the output stage to enable a second reset circuit. Upon receipt of a clock signal or other signal, such as a signal from the next stage, the second reset circuit generates an output signal which resets the output stage. Alternatively, the output stage may be reset in response to a signal from a data receiving circuit connected to the output stage.

In one specific embodiment of the invention, the sense amplifier comprises an input stage, an enable buffer, an output stage, and reset circuitry. The input stage and enable buffer are reset after input data has reached the output stage and before the output stage is reset.

BRIEF DESCRIPTION OF THE DRAWINGS

An embodiment of the invention is described below with reference to the drawings wherein.

DETAILED DESCRIPTION

Figure 1:
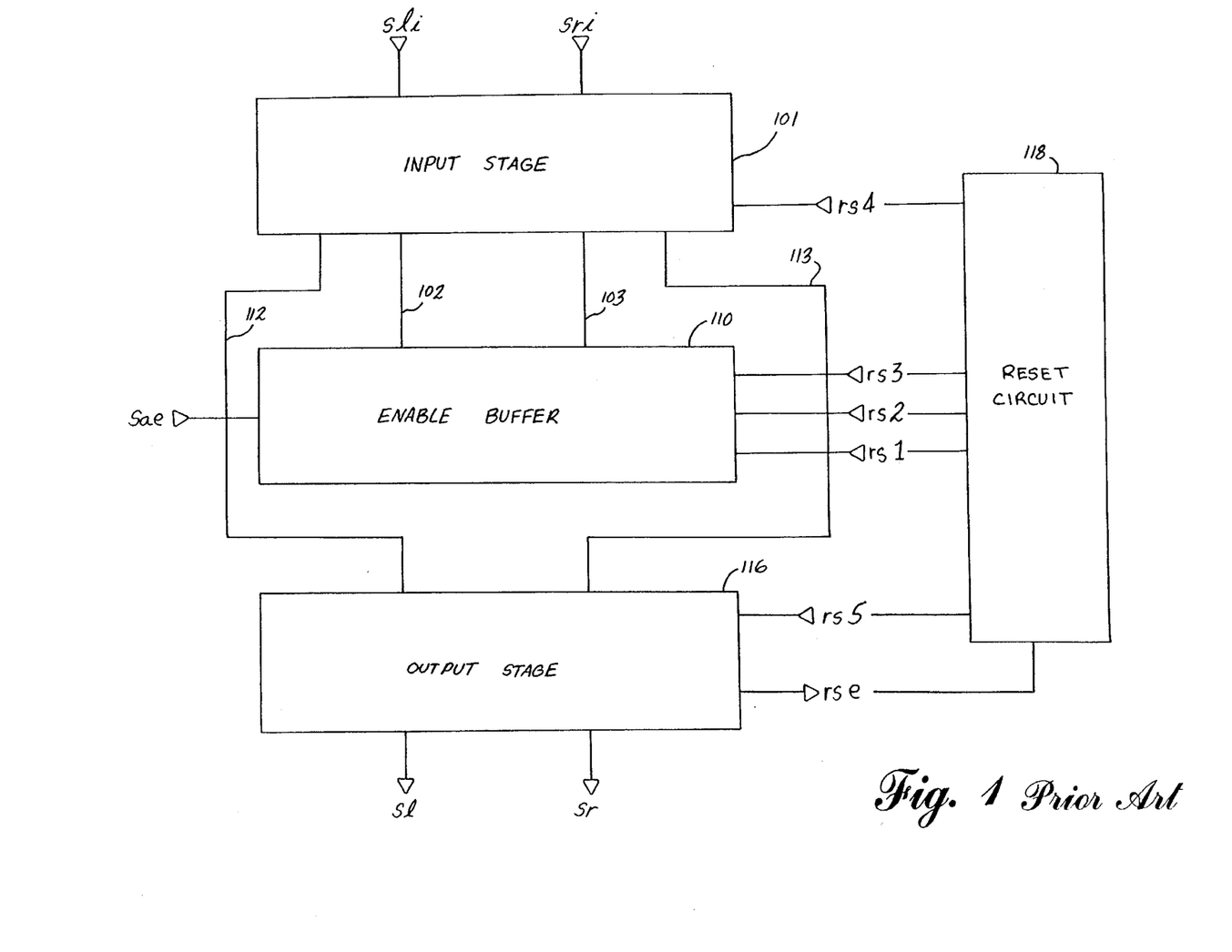
FIG. 1 is a block diagram representation of a prior art SRCMOS sense amplifier.

FIG. 1 is a block diagram representation of a prior art SRCMOS sense amplifier. The amplifier comprises an input stage 101 connected to input terminals sli and sri. The input terminals may, for example, be connected to a memory cell and receiving a relatively low voltage signal, e.g., 0.2 volts. The input stage is connected via conductors 102, 103 to enable buffer 110. Amplification of the input signal is triggered by an enable signal input sae. Once activated, the buffer 110 serves to amplify the signal to a level compatible with the remainder of the system of which the sense amplifier is a part. Output signals of the enable buffer 110 are transmitted via conductors 112, 113 to an output stage 116. The signals generated on conductors 112 and 113 are regenerated on outputs sl of output stage 116 and sr for transmission to other circuitry within the processor. The state of the input stage 101, the enable buffer 110 and the output stage 116 is retained in each of these circuits until the circuits are reset by signals occurring on one of the conductors rs1 through rs5. These reset signals are generated by reset circuit 118 in response to a signal rse generated in the output stage 116. The rse signal is transmitted to the reset circuit 118 when the state of the input signals sli, sri applied to input stage 101 reach outputs sl, sr of output stage 116. The reset circuit 118 is a well-known reset chain comprising a sequence of interconnected circuits. The circuit 118 provides a series of output signals, occurring at specified time intervals, a predetermined period of time after receipt of the rse reset enable signal. One such circuit is shown in my co-pending application entitled SELF-RESETTING CMOS MULTIPLEXER WITH STATIC OUTPUT DRIVER, Ser. No. 08/309,811, filed Sep. 21, 1994, which is incorporated by reference herein.

Figure 2:
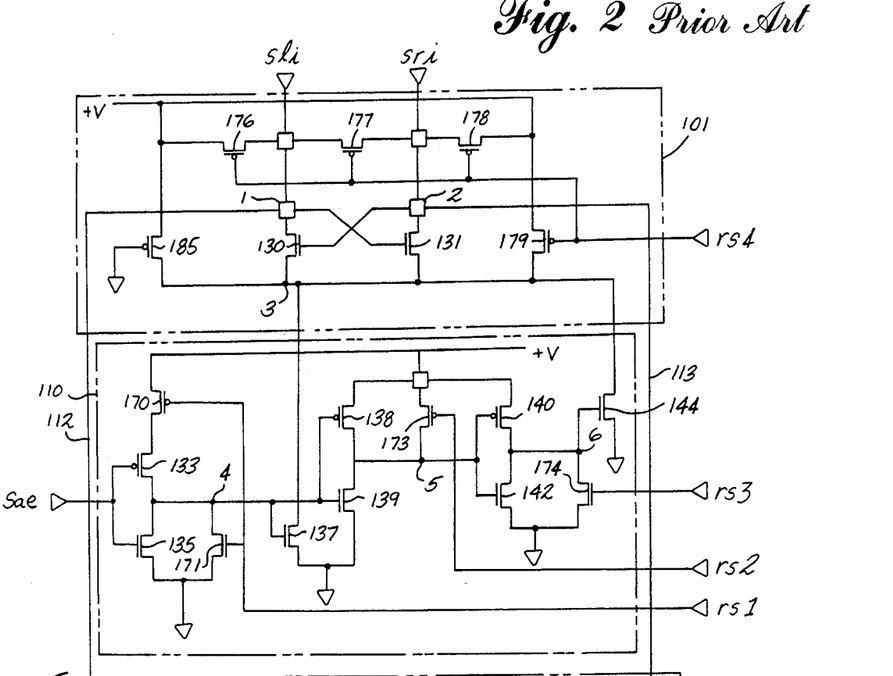
FIG. 2 is a circuit diagram representation of a prior art SRCMOS sense amplifier input stage and enable buffer.

FIG. 2 is a circuit diagram representation of the input stage 101 and the enable buffer 110 of FIG. 1. In the initialized state of input stage 101, the n-type gates 130 connected between sli and node 3, and 131, connected between sri and node 3, are in a charged state. When a low voltage level signal of a predefined level is applied to input sli, the signal is applied to node 1 and the gate input of n-type gate 131. When a low voltage level signal is applied to input sri, the signal is applied to node 2 and to the gate input of n-type gate 130. No significant current flows within the circuit, however, until the enable buffer 110 is activated by means of a signal on enable input sae. This signal is in the form of a low going pulse, i.e., the signal changes from a high voltage level to a low voltage level, to enable the circuit. In the standby state, a high voltage signal applied on input sae is applied to the gate input of p-type gate 133 and the gate input of n-type gate 135. Accordingly, gate 133 is turned off and gate 135 is conducting. The n-type gate 135 is connected between node 4 and ground and provides a low signal at node 4 when the gate is conducting. When the signal on input sae is at a low level, p-type gate 133, which is connected to node 4 and to a voltage source +V via p-type gate 170, is turned on and n-type gate 135 is turned off. Gate 170 has its gate input connected to reset rs1 and is turned on except when a high logic level reset pulse occurs on rs1. With gates 170 and 133 turned on and gate 135 turned off, a high level signal will be present on node 4 causing n-type gate 137, connected between node 3 and ground, to be turned on thereby providing a path between node 3, connected to n-type gates 130 and 131 in the input stage, and ground. Consequently, a conductive path is established between a discharged one of the inputs sli, sri and ground.

The high level signal on node 4 further causes p-type gate 138, connected between +V and node 5, to be turned off and n-type gate 139, connected between node 5 and ground, to be turned on. This provides a low voltage level signal to node 5. The low level signal present on node 5 is applied to the gate inputs of p-type gate 140 and n-type gate 142. The p-type gate 140 has one side connected to +V and another side connected to node 6. Gate 142 has one side connected to node 6 and another side connected to ground. Thus, when node 5 is low, gate 140 is turned on and gate 142 is turned off providing a high voltage level signal to node 6. Node 6 is connected to the gate input of n-type gate 144, which is connected between node 3 and ground. Thus, the high level signal on node 6 turns on gate 144 providing a current source path between node 3 and ground parallel to the current source path provided by gate 137. The two current sources are preferable of different current capacities and used to simulate a current ramping.

When a high level input signal is present on sli, node 1, and a low level input signal is present on sri, node 2, gate 131 will be turned on and gate 130 will be off. Under these circumstances, output conductor 112, connected to node 1, will have a high level output signal and conductor 113, connected to node 2, will have a low level output signal. Output leads 112, 113 of the prior art input stage 101 are input leads to prior art output stage 116. In the output stage 116, the conductor 112 is connected to the gate inputs of a p-type gate 151 and a n-type gate 155. Gate 151 is connected between +V and node 7 and gate 155 is connected between node 7 and ground. Node 7 is directly connected to output sl of the output stage. Accordingly, a high signal on conductor 112 maintains node 7 at a ground level by operation of gate 155, thereby providing a low output signal on output sl. The low level signal of node 2 is applied to the gate inputs of p-type gate 153 and n-type gate 157. Gate 153 is connected between +V and node 8 and gate 157 is connected between node 8 and ground. Accordingly, the low level signal on node 2 will cause gate 153 to conduct to provide a high level signal to node 8, which is directly connected to output sr. Cross-coupled n-type gates 159, 161 are connected between nodes 7 and ground and node 8 and ground, respectively. With a high signal on node 8 and a low signal on node 7, gate 159 is conducting and gate 161 is in the non-conducting state. Thus, in the described condition in which input sli is high and sri is low, the output sl will be low and the output sr will have a high voltage signal level. A complementary condition will occur in the circuit of FIG. 3 when the signal on node 1 is low and the signal on node 2 is high.

Figure 3:
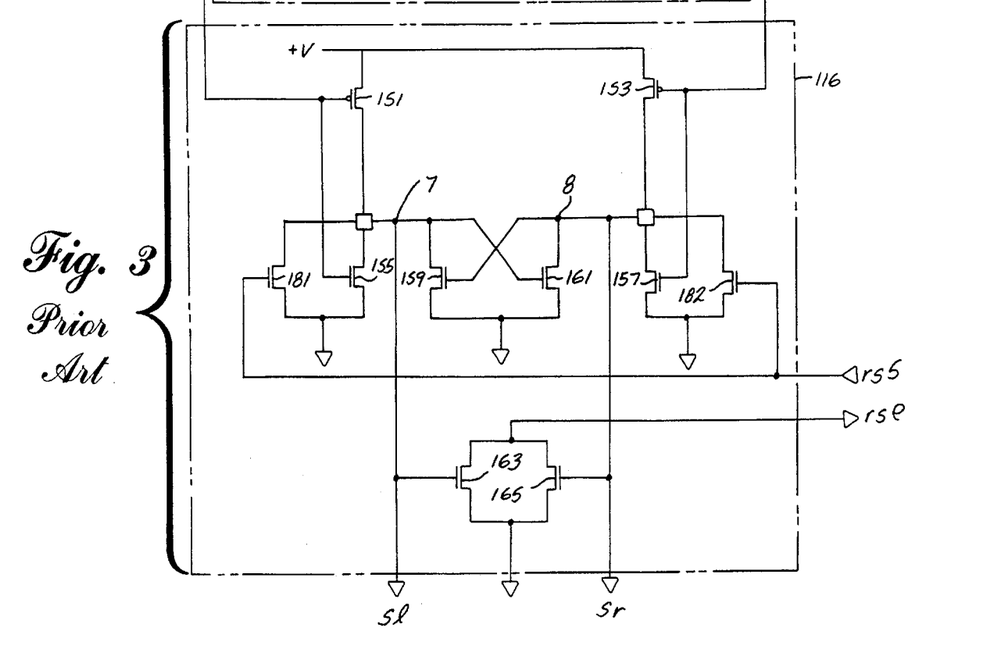
FIG. 3 is a circuit diagram representation of a prior art SRCMOS sense amplifier output stage.

A pair of n-type gates 163 and 165 are connected between output rse and ground, with the gate input of gate 163 connected to the sl output and the gate input of gate 165 connected to the sr input. When either of these outputs assumes the high voltage level, a low going reset is generated on output rse. Outputs sl and sr are low in the reset state and neither of the outputs can go high until the enable buffer 110 has been activated from input lead sae.

Referring again to FIGS. 1 through 3, the output rse of output stage 116 is applied to the reset circuit 118 which in turn generates reset signals on rs1 through rs5. These reset signals are generated in a prescribed sequence with the lower numbered reset signal being generated before a higher numbered reset signal. Thus, rs1 is generated before rs2, etc. Furthermore, the polarity of the reset signals differs, with signals on rs1, rs3 and on rs5 having high signal level, and on rs2 and rs4 having a low signal level. The reset signals are all of limited duration, temporarily controlling various gates in the circuit. Reset input rs1 is connected to the gate inputs of p-type gate 170 and n-type gate 171 of FIG. 2. Gate 170 is connected between +V and gate 133 and gate 171 is connected between node 4 and ground. A high going signal on rs1 temporarily disconnects gate 133 from the voltage source and temporarily connects node 4 to ground, thereby turning off current source gate 137. Furthermore, as a result of the operation of gate 171, node 5 is provided with a high voltage level signal via gate 138. Accordingly, gate 142 is turned on to provide a low voltage signal on node 6, thereby causing current source 144 to be turned off. Subsequent to the occurrence of a reset signal on rs1, a low level voltage signal is applied to rs2 connected to the gate input of p-type gate 173 which, in turn, is connected between +V and node 5. Gate 173 serves to charge n-type gate 139. Subsequent to the occurrence of a reset signal on rs2, a positive signal is applied to reset input rs3 which is connected to the gate circuit of n-type gate 174, connected between node 6 and ground. Subsequent to the occurrence of a reset on rs3, a low going reset signal is applied to rs4, which is connected to gate inputs p-type gates 176 through 179. Gate 176 is connected between +V and node 1 and gate 178 is connected between +V and node 2. These gates serve to charge inputs sli and sri. Gate 177 is connected between nodes 1 and 2 and serves to equalize the levels of inputs sli, slr during the charging process. Gate 179 is connected between +V and node 3. The low going signal on rs4 temporarily activates the p-type gates 176 through 179 which serve to charge n-type gates 130, 131, 137 and 144. The reset on rs5, occurring after the reset on rs4, is a low going signal applied to the gate inputs of gates 181 and 182. Gates 181 and 182 are connected between node 7 and ground and node 8 and ground, respectively. The low going signal applied to rs5 serves to temporarily connect nodes 7 and 8 to ground to return the outputs sl and sr to the low signal state. P-type gate 185 in the input stage 101 is connected between +V and node 3 and has a gate circuit connected to ground. Thus, this gate is always in the conducting state. It is a low current capacity gate and serves as a bleeder gate.

It will be apparent that in the prior art arrangement described above with respect to FIGS. 1–3, that the output of the output stage 116 is reset a predefined period of time after the enable signal occurs on the sae input of the enable buffer 110. Thus, the reset occurs independent of the reaction time of a circuit connected to outputs sl, sr, which may or may not have the signals available for a sufficiently long period of time to properly register the signals. Clearly, the delay in generating the various resets rs1 through rs5 can be adjusted. However, it is impractical to "tune" each reset circuit to the optimum delay period. The reset circuit is typically adjusted such that the delay is sufficiently large to accommodate all circuits connected to the various sense amplifiers in a particular processor. The drawback using this technique, however, is that it lengthens the cycle time of the sense amplifier thereby delaying the time that the amplifier is again available for receiving additional data and thereby introducing a time delay in the communications with the data transmitting device, such as a memory.

Figure 4:
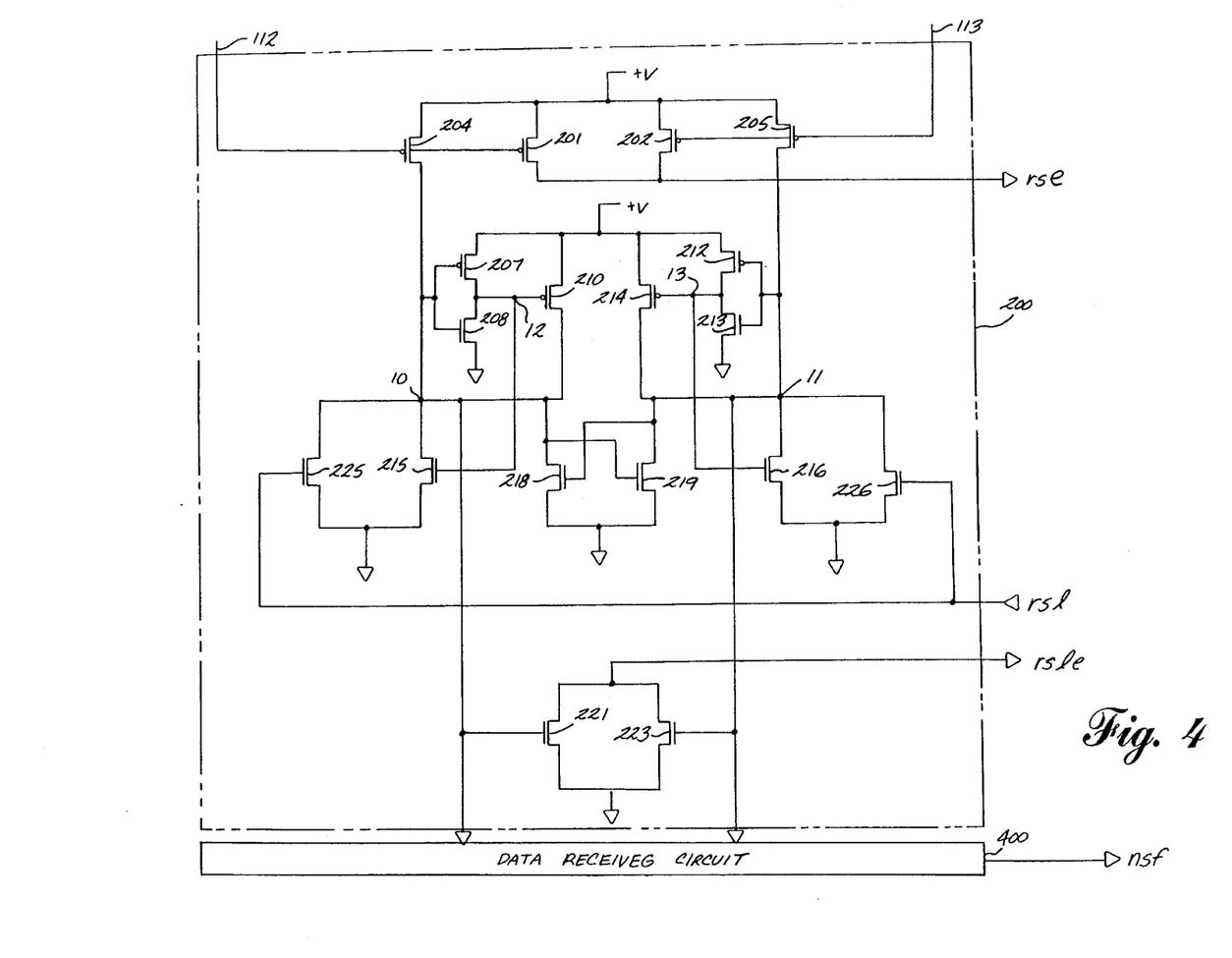
FIG. 4 is a circuit diagram representation of a SRCMOS sense amplifier output stage incorporating principles of the invention.

FIG. 4 is a circuit diagram representation of an output stage 200 connected to the output conductors 112, 113 of input stage 101. The circuit of FIG. 4 differs from the circuit of FIG. 3 in that it includes circuitry for generating separate reset enable signals rse and rsle and the circuit of FIG. 4 includes a latching arrangement. The circuit for generating the reset enable signal rse comprises a pair of p-type gates 201, 202 having their gate inputs connected to conductors 112 and 113, respectively. Thus, the reset signal rse is generated one gate delay after one of the conductors 112, 113 changes from a high logic level to a low logic level as a result of the receipt of a signal on one of the inputs sli, sri of input stage 101 and the enable signal on input sae in buffer stage 110. The output stage 200 comprises a pair of p-type gates 204, 205 having gate inputs connected to conductors 112 and 113, respectively. Gate 204 is connected between +V and node 10 and gate 205 is connected between +V and node 11. Outputs sl and sr of circuit 200 are directly connected to nodes 10 and 11, respectively. The circuit is symetrical such that the occurrence of a low going signal on one of the conductors 112, 113 has corresponding effects on the left hand portion and the right hand portion, respectively, of the circuit 200. When a low signal occurs on conductor 112, gates 201 and 204 will be activated causing a positive going signal to be generated on output rse. Output rse is connected to the reset circuit of FIG. 5, which is operative to generate reset signals on rs1 through rs4 of the input stage 101 and the enable buffer 110 described earlier herein with respect to FIG. 2.

Operation of gate 204 causes a high going signal to be applied to node 10 which is connected to the gate inputs of p-type gate 207 and n-type gate 208, respectively. Gate 207 is connected between +V and node 12 and gate 208 is connected between node 12 and ground. Node 12 is connected to the gate input of p-type gate 210 which, in turn, is connected between +V and node 10. A high voltage signal on node 10, applied by operation of gate 204, causes gate 208 to be activated and provides a low signal at node 12. Accordingly, gate 210 is activated to provide a connection between +V and node 10. When conductor 112 is returned to the high voltage level due to operation of the reset of input stage 101, the connection between +V and node 10 through gate 204 is opened. However, the connection between +V and node 10 via gate 210 will remain. Thus, the level of node 10 does not change when the state of conductor 112 is changed from low to high. In a similar fashion, a low signal on conductor 113 results in the application of a high signal to node 11 by operation of gate 205. Node 11 is connected to gate terminals of p-type gate 212 and n-type gate 213. Gate 212 is connected between +V and node 13 and gate 213 is connected between node 13 and ground. Node 13 is connected to gate input of p-type gate 214 which is connected between +V and node 11. Accordingly, when the signal level on conductor 113 is a low voltage level, a high voltage level signal is applied to node 11 via gate 205 and a low voltage level is applied to node 13. Consequently, a connection is established between +V and node 11 via gate 214 and the signal level at node 11, and hence at the SR output connected to node 11, is maintained after the signal on conductor 113 is returned to a high level due to the reset of input stage 101 and enable buffer 110.

The n-type gates 215 and 216 are connected between node 10 and ground and node 11 and ground, respectively. Their gate inputs are connected to nodes 12 and 13, respectively, and gates 215 and 216 are in a conducting state when the nodes, to which the gate inputs are connected, are at a high logic level. Cross-couples n-type gates 218 and 219 are connected between node 10 and ground and node 11 and ground, respectively. A high logic level signal on one of these nodes will result in the other of the nodes being maintained at a low level. N-type gates 221 and 223 have gate inputs connected to outputs sl and sr, respectively, and are connected between output terminal rsle and ground. When one of the outputs sl, sr is changed to the high logic level, a low logic level signal will be applied to output rsle connected to reset circuit 300 of FIG. 6. That circuit provides a reset signal on the rs1 input terminal of output stage 200. The rs1 input terminal is connected to gate inputs of N-type gates 225 and 226 which are connected between node 10 and ground and node 11 and ground, respectively. A high level signal on input rs1 causes gates 225 and 226 to provide a low level logic signal on both nodes 10 and 11. This will cause gates 208, 213, 218 and 219 to be turned off and cause gates 207 and 212 to be in the conducting state, thereby applying a high logic signal to the gate circuits of gates 215 and 216 to place these gates in the conducting state. This keeps nodes 10 and 11 and outputs sl and sr at a low logic level reset condition.

A data receiving circuit 400 is shown in FIG. 4 connected to outputs sl, sr. The circuit 400 is adapted to generate a signal on output nsf indicative of receipt of and/or registration of the signal on outputs sl, sr in data receiving circuit 400. The signal on output nsf is employed in the circuit of FIG. 6 to generate a signal on reset input rs1 of FIG. 4.

Figure 5:
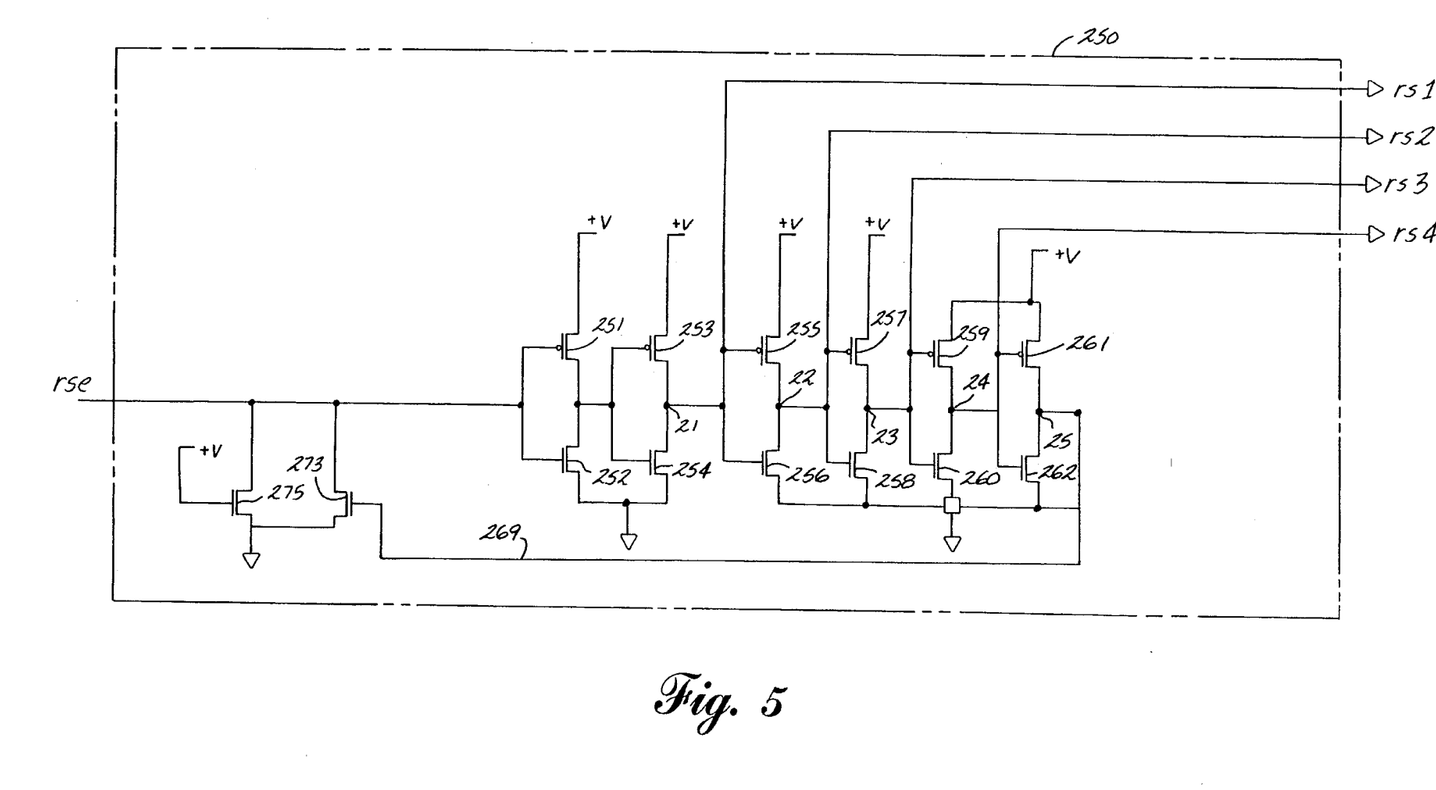
FIG. 5 is a circuit diagram representation of a reset chain for resetting the input stage and enable buffer of FIG. 7.

FIG. 5 is a schematic representation of reset circuit 250 including a well-known reset chain. The circuit comprises a plurality of pairs of interconnected p-type gates and n-type gates. In each case, the p-type gate is connected between +V and an intermediate node and the n-type gate is connected between the intermediate node and ground. Each pair has interconnected gate inputs and the intermediate node of a first pair of gates is connected to the gate inputs of a subsequent pair of gates. The circuit 250 of FIG. 5 comprises six interconnected pairs of gates 251, 252 through 261, 262 and has a reset-enable input rse connected to the rse output of output stage 200. The input rse is connected to the interconnected gate inputs of the pair of gates 251, 252. These gates are responsive to a high level logic signal generated by gates 201, 202 of FIG. 4 to turn off gate 251 and turn on gate 252, thereby providing a low logic level signal to the gate inputs of gates 253, 254. As a result, node 21 will assume a high logic level, thereby providing a high logic level reset signal on output rs1. Furthermore, gate 255 will be turned on and gate 256 will be turned off causing a low level output signal at node 22 and output rs2. In a similar fashion, a high level logic signal is produced on node 23 output rs3 and a low level logic signal is produced on node 24 and rs4. Consequently, a high level logic signal will occur on node 25 and on conductor 269 connected to the gate input of n-type gate 273. Gate 273 is connected between input rse and ground, and the signal on conductor 269 will cause gate 273 to connect rse to ground. As a result, the outputs rs1 through rs4 will be returned to their original states. N-type gate 275 is connected between input rse and ground and has its gate circuit connected to +V. Gate 275 acts as a bleeder circuit providing a low current drain for the rse input.

Figure 6:
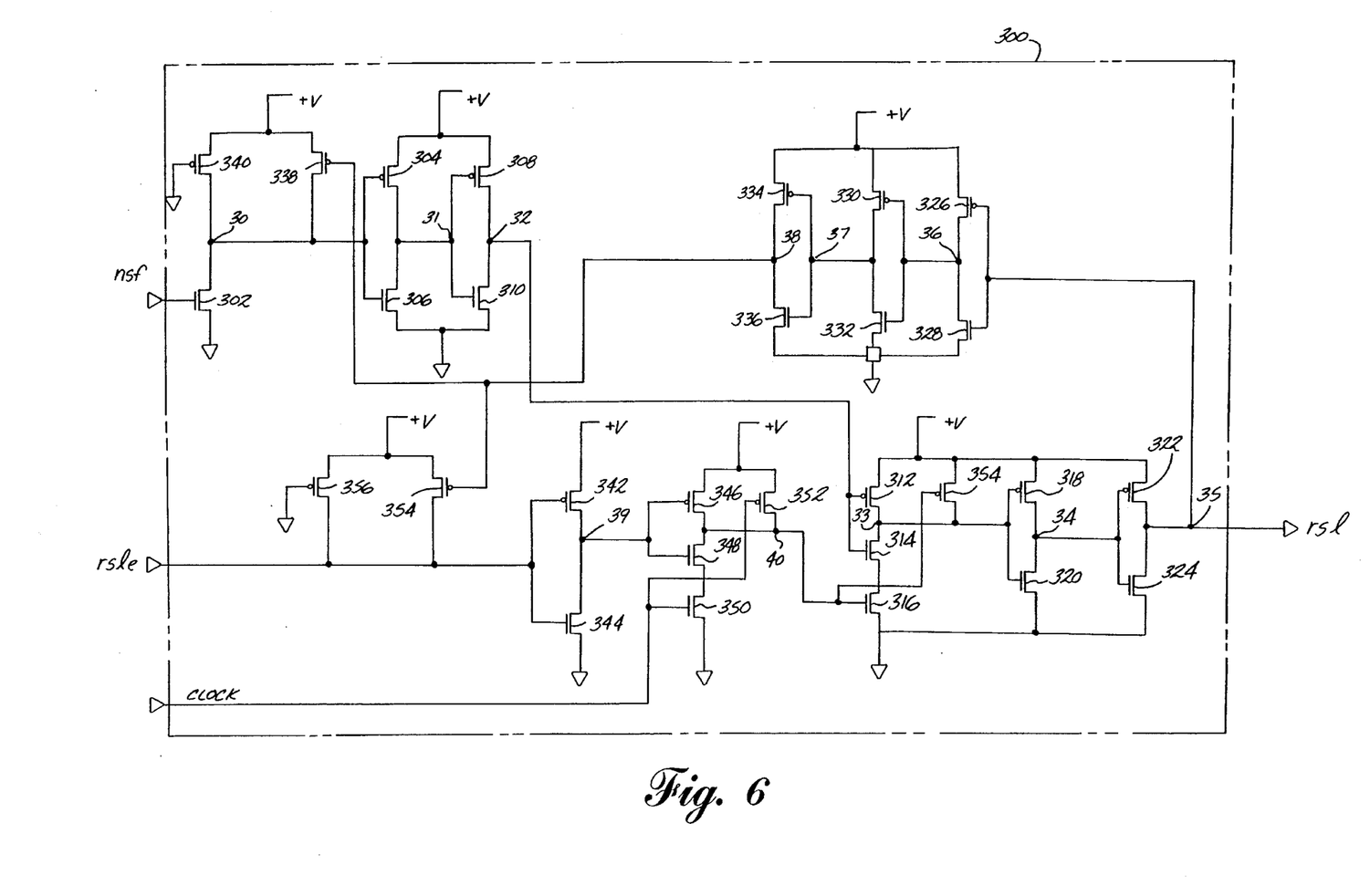
FIG. 6 is a circuit diagram representation of the output stage reset circuit for resetting the output stage of FIG. 4.
Figure 7:
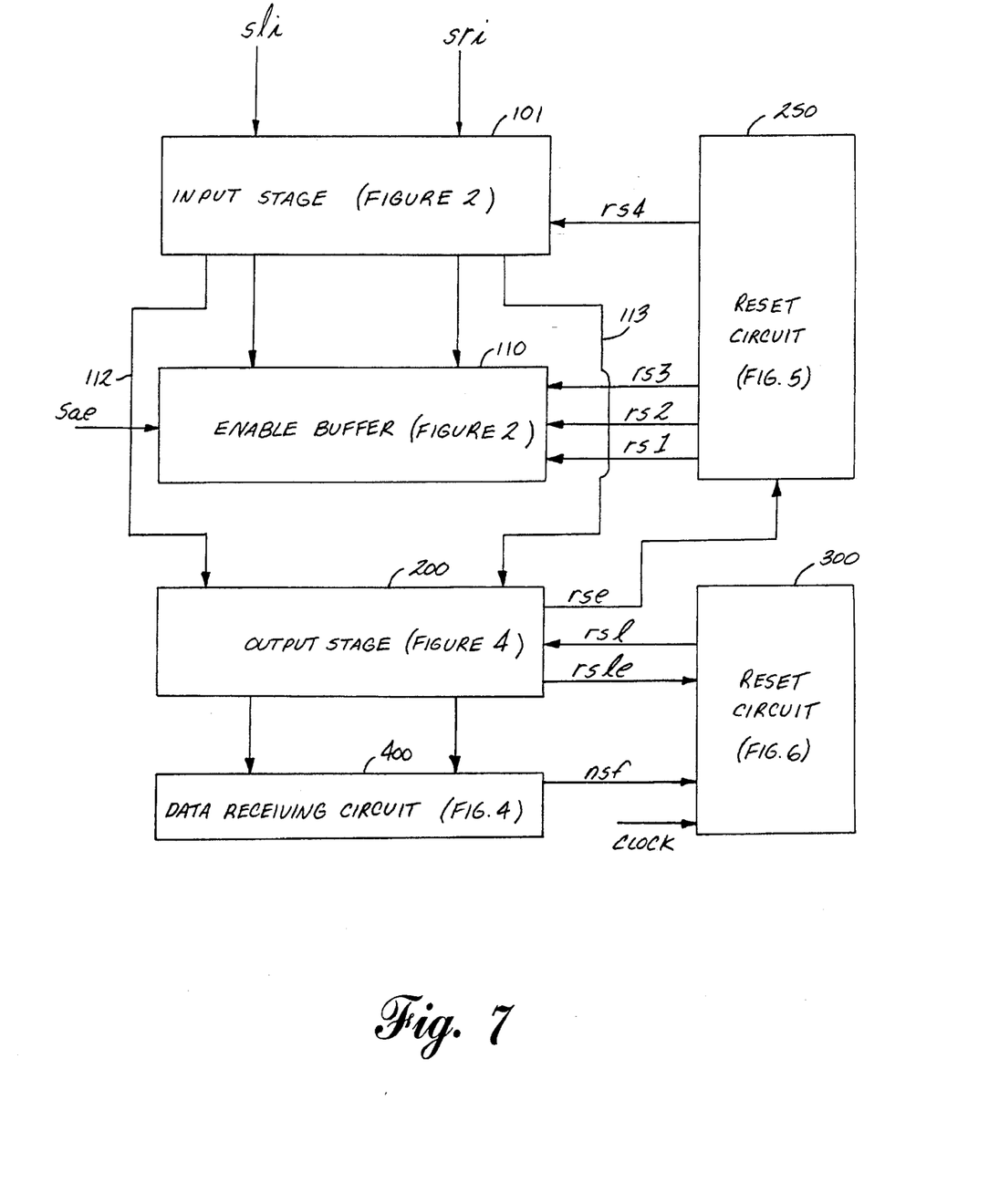
FIG. 7 is a block diagram representation showing a connection among corresponding numbered circuit blocks shown in FIGS. 2, 4, 5 and 6.

FIG. 6 is a circuit diagram representation of a reset circuit 300 generating a positive reset signal on input rs1 of the output stage 200 of FIG. 4. In FIG. 6, the low going reset enable rsle, generated by the output stage 200, is logically combined with another input in reset circuit 300. The other input may be a clocked input or a signal from a data receiving circuit 400 connected to the sl and sr output terminals of circuit 200. In this particular embodiment, the rs1 reset is generated only when the rsle signal and the clock signal are present or when the signal from the data receiving circuit 400 is received. The reset circuit 300 comprises an input gate, n-type gate 302 having its gate input connected to the circuit input nsf. This input is connected to output nsf of data receiving circuit 400 and provides a signal indicating that the next stage i.e., data recieving circuit 400, has properly received the output signal of output stage 200. In this particular example, the signal on input nsf is a positive going signal causing gate 302 to be turned on. Gate 302 is connected between node 30 and ground, thereby providing a low logic level signal on node 30 when gate 302 is turned on. Node 30 is connected to the gate inputs of a p-type gate 304 and an n-type gate 306. Gate 304 is connected between +V and node 31 and gate 306 is connected between node 31 and ground. Node 31 is further connected to gate inputs of p-type gate 308 and n-type gate 310. Gate 308 is connected between +V and node 32 and gate 310 is connected between node 32 and ground. Thus, when the positive going signal is received at input terminal nsf, the node 32 will assume a low logic level state. Node 32 is connected to gate inputs of p-type gate 312 and n-type gate 314. Gate 312 is connected between +V and node 33 and gate 314 is connected between node 33 and n-type gate 316. Node 33 is connected to gate inputs of p-type gate 318 and n-type gate 320. Gate 318 is connected between +V and node 34 and gate 320 is connected between node 34 and ground. Node 34 is connected to gate inputs of p-type gate 322 and n-type gate 324. Gate 322 is connected between +V and node 35 and gate 24 is connected between node 35 and ground. Node 35 is connected to the output rs1 which, by means of external wiring not shown in the drawing, is connected to input rs1 of output stage 200 of FIG. 4. When the node 32 is at the low level logic state as a result of the occurrence of a signal on input terminal nsf, node 33 will assume a high level logic state by operation of gate 312 and node 34 will assume a low level logic state by operation of gate 320. As a consequence, node 35 and the output rs1 will assume the high level logic state by operation of gate 322. Thus, a high going signal on input nsf results in a high going output signal on output rs1. This is used to reset and charge the various gates of output stage 200, as described earlier with reference to FIG. 4.

Node 35 is connected to gate inputs of p-type gate 326 and n-type gate 328. Gate 326 is connected between +V and node 36 and gate 328 is connected between node 36 and ground. Node 36 is connected to inputs of p-type gate 330 and n-type gate 332. Gate 330 is connected between +V and node 37 and gate 332 is connected between node 37 and ground. Node 37 is connected to gate inputs of p-type gate 334 and n-type gate 336. Gate 334 is connected between +V and node 38 and gate 336 is connected between node 38 and ground. Node 38 is connected to the gate input of p-type gate 338 connected between +V and node 30. Thus, a high going output signal on node 35 results in a low going signal on node 38 causing gate 338 to charge node 30 and gate 302. P-type gate 340 has a gate input connected to ground and serves as a bleeder gate to provide a low current to node 30.

Input rsle is connected to output terminal rsle of circuit 200 by means of external wiring not shown in the drawing. Input rsle is also connected to gate inputs of p-type gate 342 and n-type gate 344. Gate 342 is connected between +V and node 39 and gate 344 is connected between node 39 and ground. Node 39 is connected to gate inputs of p-type gate 346 and n-type gate 348. Gate 346 is connected between +V and node 40 and gate 348 is connected between node 40 and gate 350. Gate 350 is connected between gate 348 and ground and its gate circuit is connected to the clock input. The rsle input receives a low going signal from the rsle output of circuit 200 in FIG. 4 and the clock input receives a high going signal from the system clock. When the two signals are present simultaneously, a high logic value signal will be applied to node 39 connected to the gate circuits of gate 346 and 348 and a high going signal will also be applied to gate input of gate 350. Consequently, node 40 will assume a low logic level. The clock input is also connected to the gate circuit of p-type gate 352 connected between +V and node 40. This gate will function to restore node 40 to a high logic level after the signal on the clock input has returned to the low state. It will be apparent that node 40 will be in the low state only when a high voltage level signal is present on the clock input and a low voltage level signal is present on the rsle input.

Node 40 is connected to the gate input of gate 316 connected between gate 314 and ground. Node 40 is also connected to the gate input of p-type gate 354 which is connected between +V and node 33. This gate serves to provide a current source for node 33 when node 40 is in the low logic state. When node 40 is in the low logic state, nodes 33 and 35 will be in the high logic state generating a positive going signal on output rs1. Furthermore, the level of node 38 will be a low logic level which is applied to gate circuit of p-type gate 354 connected between +V and the rsle input. Consequently, this gate will conduct and charge the rsle input. A further p-type gate 356 has a gate circuit connected to ground and acts as a bleeder gate to provide a low current to the rsle input.

It will be apparent that the circuit 300 of FIG. 6 generates a positive going signal on output rse when a high going signal is present on input nsf or when a low level logic signal is present on rsle simultaneously with a high level logic signal on the clock input. Various other logic circuits may be constructed to perform other logic functions, such as essentially an AND function of the inputs nsf and the clock input, together with the inverse of the rsle input or such other combinations as may be desirable.

The above-described arrangement is illustrative of an application of the invention. It will be understood that other arrangements may be devised by those skilled in the art without departing from the scope of the invention as defined by the appended claims.

What is claimed is:

1. In a CMOS sense amplifier circuit comprising an input stage and an output stage, a method of resetting the amplifier circuit comprising the steps of:

receiving an input signal in the input stage;

transmitting the input signal from the input stage to the output stage;

generating an input stage reset enable signal;

latching the received input signal in the output stage;

separately generating an output stage reset enable signal;

resetting the input stage in response to the input stage reset enable signal and in preparation for a receipt of a next input signal; and subsequently resetting the output stage in response to the output stage reset enable signal.

2. The method in accordance with claim 1 and wherein the step of resetting the output stage is performed in response to a clock signal occurring subsequent to the step of generating the output stage reset enable signal.

3. The method in accordance with claim 1 and further comprising:

the step of transmitting an output signal corresponding to the input signal from the sense amplifier circuit to a data receiving circuit; and the step of transmitting a return signal indicative of receipt of the transmitted output signal from the data receiving circuit to the sense amplifier circuit and wherein step of resetting the output stage comprises resetting the output stage after receipt of the return signal in the sense amplifier circuit.

4. In a CMOS sense amplifier circuit comprising an input stage having input terminals and output terminals and an output stage having input terminals and output terminals, a method of resetting the amplifier circuit comprising the steps of:

receiving an input signal at the input terminals of the input stage;

transmitting the input signal from the input stage and receiving the transmitted signal at the input terminals of the output stage;

generating an input stage reset enable signal after to the step of receiving the transmitted signal at the input terminals of the output stage;

latching the received signal in an output stage;

generating a separate output stage reset enable signal after the step of latching;

resetting the input stage in response to the input stage reset enable signal and in preparation for a receipt of a next input signal; and subsequently resetting the output stage in response to the separate output stage reset enable signal.

5. The method in accordance with claim 4 and wherein the step of resetting the output stage is performed in response to a clock signal occurring subsequent to the step of generating the output stage reset enable signal.

6. The method in accordance with claim 4 and further comprising:

the step of transmitting an output signal corresponding to the input signal from the sense amplifier circuit to a data receiving circuit; and the step of transmitting from the data receiving circuit to the sense amplifier circuit a return signal indicative of receipt of the transmitted output signal in the data receiving circuit and wherein step of resetting the output stage comprises resetting the output stage after receipt of the return signal in the sense amplifier circuit.

* * * * *